(12) United States Patent
Hashimoto et al.

(10) Patent No.: US 6,583,557 B2
(45) Date of Patent: Jun. 24, 2003

(54) ORGANIC LUMINESCENT ELEMENT

(75) Inventors: Yuichi Hashimoto, Tokyo (JP); Yoichi Osato, Kanagawa (JP); Koichi Suzuki, Kanagawa (JP); Akihiro Senoo, Kanagawa (JP); Hiroshi Tanabe, Kanagawa (JP); Kazunori Ueno, Kanagawa (JP); Seiji Mashimo, Kanagawa (JP); Shinichi Urakawa, Tokyo (JP)

(73) Assignee: Canon Kabushiki Kaisha, Tokyo (JP)

( * ) Notice: Subject to any disclaimer, the term of this patent is extended or adjusted under 35 U.S.C. 154(b) by 57 days.

(21) Appl. No.: 09/840,104

(22) Filed: Apr. 24, 2001

(65) Prior Publication Data

US 2001/0048272 A1 Dec. 6, 2001

(30) Foreign Application Priority Data

Apr. 26, 2000 (JP) ........................................ 2000-125348

(51) Int. Cl.$^7$ ................................................. H01J 1/62

(52) U.S. Cl. ........................................ 313/506; 313/509

(58) Field of Search ................................ 313/504, 506, 313/509

(56) References Cited

U.S. PATENT DOCUMENTS

| | | | |
|---|---|---|---|
| 3,172,862 A | 3/1965 | Gurnee et al. | 252/301.3 |
| 3,173,050 A | 3/1965 | Gurnee et al. | 313/108 |
| 3,710,167 A | 1/1973 | Dresner et al. | 313/108 |
| 4,356,429 A | 10/1982 | Tang | 313/503 |
| 4,539,507 A | 9/1985 | VanSlyke et al. | 313/504 |
| 4,720,432 A | 1/1988 | VanSlyke et al. | 428/457 |
| 4,769,292 A | 9/1988 | Tang et al. | 428/690 |
| 5,633,300 A | 5/1997 | Dasgupta | 524/55 |

FOREIGN PATENT DOCUMENTS

| | | |
|---|---|---|
| JP | 59-194393 | 11/1984 |
| JP | 63-264692 | 11/1988 |
| JP | 2-260388 | 10/1990 |
| JP | 3-163188 | 7/1991 |
| JP | 3-261091 | 11/1991 |
| JP | 4-137483 | 5/1992 |
| JP | 4-212284 | 8/1992 |
| JP | 5-21159 | 1/1993 |
| JP | 5-36475 | 2/1993 |
| JP | 5-89959 | 4/1993 |
| JP | 5-101885 | 4/1993 |
| JP | 5-335080 | 12/1993 |
| JP | 6-96858 | 4/1994 |
| JP | 6-119970 | 4/1994 |
| JP | 6-176867 | 6/1994 |
| JP | 7-14675 | 1/1995 |
| JP | 7-147189 | 6/1995 |
| JP | 7-161474 | 6/1995 |
| JP | 7-169569 | 7/1995 |

(List continued on next page.)

OTHER PUBLICATIONS

M. Pope et al., "Electroluminescence in Organic Crystals," 38 *J. Chem. Phys.* 2042 (1963).

(List continued on next page.)

*Primary Examiner*—Tho D. Ta
*Assistant Examiner*—Ann McCamey
(74) *Attorney, Agent, or Firm*—Fitzpatrick, Cella, Harper & Scinto

(57) ABSTRACT

An organic luminescent element includes a substrate, an anode, a cathode, at least one organic material layer interposed between the anode and the cathode, and a sealing film containing a ferroelectric material provided on the anode or the cathode on the organic material layer. Preferably, the organic luminescent element further includes a counter electrode provided on the sealing film. Preferably, the substrate is transparent, and the anode is composed of indium tin oxide.

10 Claims, 1 Drawing Sheet

FOREIGN PATENT DOCUMENTS

| | | |
|---|---|---|
| JP | 7-192868 | 7/1995 |
| JP | 8-78159 | 3/1996 |
| JP | 8-96955 | 4/1996 |
| JP | 8-96962 | 4/1996 |
| JP | 8-111286 | 4/1996 |
| JP | 8-185982 | 7/1996 |
| JP | 9-153395 | 6/1997 |
| JP | 9-204981 | 8/1997 |
| JP | 9-245964 | 9/1997 |
| JP | 10-275680 | 10/1998 |

OTHER PUBLICATIONS

W. Helfrich et al., "Recombination Radiation in Anthracene Crystals," 14(7) *Phys. Rev. Lett.* 229 (1965).

C.W. Tang et al., "Organic Electroluminescent Diodes," 51(12) *Appl. Phys. Lett.* 913 (1987).

W. Helfrich et al., "Transients of Volume–Controlled Current and of Recombination Radiation in Anthracene," 44 *J. Chem. Phys.* 2902 (1966).

H.P. Schwob et al., "Charge Transfer Exciton Fission in Anthracene Crystals," 58(4) *J. Chem. Phys.* 1542 (1973).

G.J. Hoytink et al., "Magnetic Field Effects on Recombination Radiation in Tetracene Crystal," 36(3) *Chem. Phys. Lett.* 345 (1975).

P.S. Vincett et al., "Electrical Conduction and Low Voltage Blue Electroluminescence in Vacuum–deposited Organic Films," 94 *Thin Solid Films* 171 (1982).

R.H. Partridge et al., "Electroluminescence From Polyvynilcarbazole Films: Electroluminescent Devices," 24 *Polymer* 748 (1983).

S. Hayashi et al., "Electroluminescence of Perylene Films With a Conducting Polymer as an Anode," 2(9) *Jpn. J. Appl. Phys.* L773 (1986).

C. Adachi et al., "Electroluminescence in Organic Films With Three–Layer Structure," 27(2) *Jpn. J. Appl. Phys.* L269 (1988).

C. Adachi et al., "Organic Electroluminescent Device With a Three–Layer Structure," 27(4) *Jpn. J. Appl. Phys.* L713 (1988).

ORGANIC LUMINESCENT ELEMENT

BACKGROUND OF THE INVENTION

1. Field of the Invention

The present invention relates to a luminescent element having an organic material layer composed of a luminescent material in which recombination energy of injected charge is directly converted into optical energy by an applied electric field.

More particularly, the invention relates to a luminescent element, unlike conventional incandescent lamps, fluorescent lamps, light emitting diodes, etc., used in organic light emitting diode (OLED) panels which are thin, lightweight, solid-state devices having a large area and high resolution, and are capable of high-speed operation, thus satisfying advanced requirements.

2. Description of the Related Art

Pope et al., observed electroluminescence (EL) in an organic material, namely, single-crystal anthracene, in 1963 (*J. Chem. Phys.*, 38, 2042 (1963)). Subsequently, Helfinch and Schneider successfully observed relatively strong EL in an injection-type luminescent element using a solution electrode system having high injection efficiency (*Phys. Rev. Lett.*, 14, 229 (1965)).

Many studies of organic luminescent materials containing conjugated organic hosts and conjugated organic activators having condensed benzene rings have been conducted, such as those disclosed in U.S. Pat. Nos. 3,172,862, 3,173,050, and 3,710,167; *J. Chem. Phys.*, 44, 2902 (1966); *J. Chem. Phys.*, 50, 14364 (1969); *J. Chem. Phys.*, 58, 1542 (1973); and *Chem. Phys. Lett.*, 36, 345 (1975). Examples of disclosed organic hosts include naphthalene, anthracene, phenanthrene, tetracene, pyrene, benzopyrene, chrysene, picene, carbazole, fluorene, biphenyl, terphenyl, triphenylene oxide, dihalobiphenyl, trans-stilbene, and 1,4-diphenylbutadiene. Examples of disclosed activators include anthracene, tetracene and pentacene. Since these organic luminescent materials are provided as single layers having a thickness of more than 1 $\mu$m, a high electric field is required for luminescence.

Under these circumstances, thin film elements formed by a vacuum deposition process have been proposed (for example, *Thin Solid Films*, 94, 171 (1982); *Polymer*, 24, 748 (1983); and *Jpn. J. Appl. Phys.*, 25, L773 (1986)). Although the thin film elements are effective in reducing the driving voltage, their luminance level is not sufficient for practical use.

Recently, Tang et al., have developed a luminescent element having a high luminance at a low driving voltage (*Appl. Phys. Lett.*, 51, 913 (1987) and U.S. Pat. No. 4,356,429). The luminescent element is fabricated by depositing two extremely thin layers, namely, a charge-transporting layer and a luminescent layer, between an anode and a cathode by a vacuum deposition process. Layered organic LED devices of this type are also disclosed in, for example, Japanese Patent Laid-Open Nos. 59-194393, 63-264692, and 3-163188, U.S. Pat. Nos. 4,539,507 and 4,720,432, and *Appl. Phys. Lett.*, 55, 1467 (1989).

Also, an organic LED element of a triple-layered structure in which a carrier transport ability and a luminescent ability are separately provided is disclosed in *Jpn. J. Appl. Phys.*, 27, L269 and L713 (1988). Since the restrictions on the selection of dyes in the luminescent layer due to the carrier transportability are relieved in such a luminescent element, the selection of possible dyes in the luminescent layer is considerably increased. Furthermore, the device configuration suggests the possibility of improved luminescence by effectively trapping holes and electrons (or excitons) in the central luminescent layer.

Layered organic LED elements are generally formed by vacuum deposition processes. Luminescent elements having considerably high luminance are also formed by casting processes (as described in, for example, Extended Abstracts of the 50th Meeting (1989), p. 1006, and the 51st Meeting (1990), p. 1041, of The Japan Society of Applied Physics).

Moreover, considerably high light emission efficiency is also achieved by a single-layered mixture-type organic LED device, in which the layer is formed by immersion-coating of a solution containing polyvinyl carbazole as a hole-transporting compound, an oxadiazole derivative as an electron-transporting compound and coumarin-6 as a luminescent material, as described in Extended Abstracts of the 38th Meeting 1991, p. 1086, of The Japan Society of Applied Physics and Related Societies.

As described above, organic LED devices have been significantly improved, and applications thereof to broad areas are expected.

However, materials and fabrication methods for the organic LED devices have not yet been thoroughly researched. There are still problems with durability, such as changes over time due to light emission of higher luminance and use for a long period of time, and deterioration due to atmospheric gas which is humid and contains oxygen.

For example, fluorescent organic solids which are used as materials for luminescent layers are easily affected by moisture, oxygen, etc. Electrodes formed on luminescent layers directly or with hole-injecting layers or electron-injecting layers therebetween are easily degraded by oxidation. Consequently, when conventional organic LED elements are operated in air, luminous characteristics rapidly degrade. Therefore, in order to obtain practical organic LED elements and organic LED devices, the elements must be sealed in order to prevent the luminescent layers from being affected by moisture, oxygen, etc. and so that electrodes are not oxidized, thereby prolonging life.

However, an effective sealing method for organic LED elements has not yet been developed. For example, when a method for sealing an inorganic EL element is used for an organic LED element, that is, when a back glass plate is provided on the exterior of a back electrode and a silicone oil is enclosed between the back electrode and the back glass plate, the silicone oil infiltrates into the luminescent layer through the electrode, or through the electrode and a hole-injecting layer or an electron-injecting layer, and the luminescent layer is altered by the silicone oil, and thus the luminous characteristics of the organic LED element are greatly degraded or the light emission capability is completely lost.

Additionally, when a resin coating layer provided for mechanical protection and the like is used for sealing an organic LED element, since certain types of resin coating solutions dissolve the luminescent layer as described above, luminous characteristics of the organic LED element are greatly degraded or the light emission capability is completely lost.

Japanese Patent Laid-Open No. 5-21159 discloses a structure in which an insulating layer containing barium titanate and a polyamide as a hygroscopic material is provided between an electrode and a luminescent layer, and Japanese Patent Laid-Open No. 6-119970 discloses a structure in which an insulating layer containing barium titanate and a conductive water-capturing layer are provided between a luminescent layer and an electrode. However, if such an insulating layer is provided between an organic material layer and an electrode in a charge-injection-type organic luminescent element, luminance may be decreased.

Although various sealing techniques have been attempted as disclosed in Japanese Patent Laid-Open Nos. 2-260388, 3-261091, 4-137483, 4-212284, 5-36475, 5-89959, 5-101885, 5-335080, 6-96858, 6-176867, 7-14675, 7-147189, 7-161474, 7-169569, 7-192868, 8-78159, 8-96955, 8-96962, 8-111286, 8-185982, 9-153395, 9-204981, 9-245964, 10-275680, etc., the foregoing problem has not yet been sufficiently solved.

Additionally, luminescence of an organic LED element is caused by recombination of charges (electrons and holes) injected from electrodes. However, mobility of charge is greatly inhibited by traps and the like in the organic material layer, and the amount of charges (electrons and holes) injected from the electrodes becomes unbalanced, resulting in a decrease in luminance.

Therefore, to enable stable operation of the element and to prolong the element life, the space-charge effect in the element must be improved.

SUMMARY OF THE INVENTION

Accordingly, it is an object of the present invention to provide a luminescent element having a long life and a stable optical output, and in which moisture, oxygen, etc., are prevented from entering an organic material layer in the element, and space charges in the element are overcome.

In accordance with the present invention, an organic luminescent element includes a substrate, an anode, a cathode, at least one organic material layer interposed between the anode and the cathode, and a sealing film containing a ferroelectric material provided on the anode or the cathode disposed on the organic material layer.

Preferably, the organic luminescent element further includes a counter electrode provided on the sealing film. Preferably, the sealing film is provided on the cathode, and an electric potential higher than that of the cathode, more preferably, a positive electric potential is applied to the counter electrode. Alternatively, preferably, the sealing film is provided on the anode, and an electric potential lower than that of the anode, more preferably, a negative electric potential is applied to the counter electrode.

Preferably, the substrate is transparent, and the anode contains indium tin oxide (ITO).

The counter electrode may be connected to a poling power supply. Alternatively, the counter electrode may have the same electric potential as that of the cathode when the sealing film is provided on the anode, and the counter electrode may have the same electric potential as that of the anode when the sealing film is provided on the cathode.

Preferably, the organic luminescent element emits light by DC driving or pulsed driving.

Combinations of the above features are also in the scope of the present invention.

In accordance with the present invention, space charges accumulated in the organic material layer of the element are diffused, and it is possible to provide a luminescent element which can be stably operated for a long period of time.

Further objects, features and advantages of the present invention will be apparent from the following description of the preferred embodiments with reference to the attached drawings.

DESCRIPTION OF THE PREFERRED EMBODIMENTS

Figure 1:
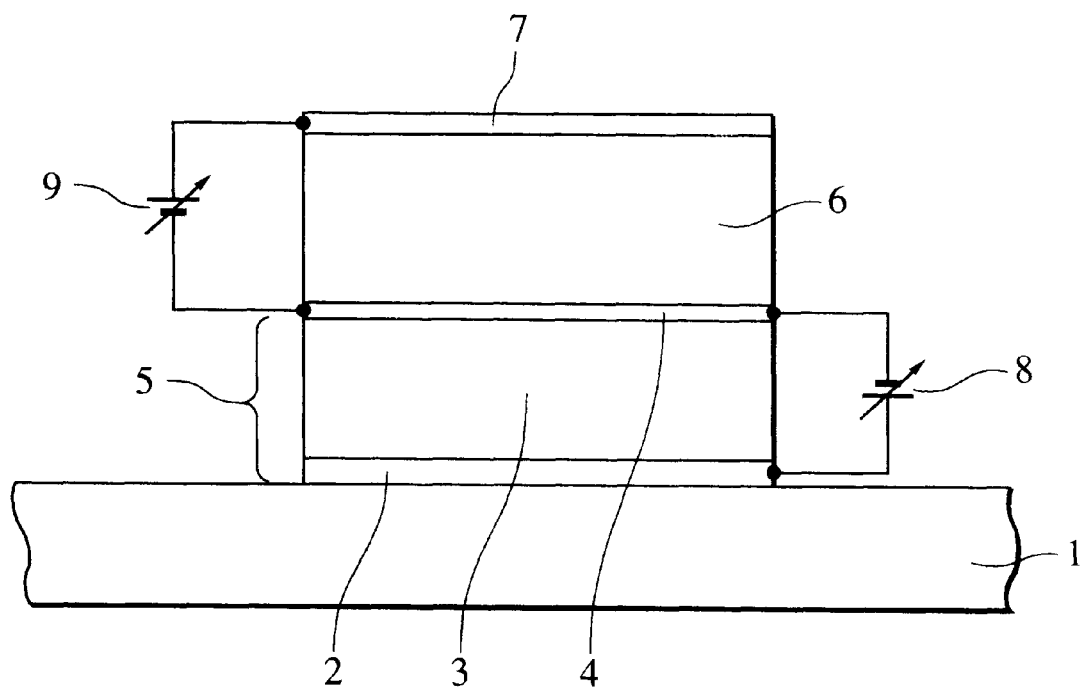
FIG. 1 is a sectional view of a luminescent element in an embodiment of the present invention.

FIG. 1 is a sectional view of a luminescent element in an embodiment of the present invention. As shown in the drawing, the luminescent element includes a laminate 5 provided on a transparent substrate 1. The laminate 5 includes an anode 2, at least one layer composed of an organic compound (hereinafter referred to as an organic material layer) 3, and a cathode 4 deposited in the stated order. A sealing film 6 and a counter electrode 7 are provided on the cathode 4, in the stated order.

In the present invention, the laminate 5 may have any one of the structures (1) to (4) below.

(1) Electrode (Cathode)/Luminescent layer/Hole-injecting layer/Electrode (Anode)

(2) Electrode (Anode)/Luminescent layer/Electron-injecting layer/Electrode (Cathode)

(3) Electrode (Anode)/Hole-injecting layer/Luminescent layer/Electron-injecting layer/Electrode (Cathode)

(4) Electrode (Anode or Cathode)/Luminescent layer/ Electrode (Cathode or Anode)

The present invention is applicable to a luminescent element including the laminate 5 having any one of the above structures.

The shapes, sizes, materials, and fabrication methods for such laminates 5 may be appropriately selected depending on the applications, etc. of luminescent elements. The shape, size, material, and fabrication method for the laminate 5 are not particularly limited in the present invention. However, in order to obtain a luminescent element having a long life, preferably, degradation of the characteristics of the organic material layer 3 in the fabrication process of the laminate 5 is avoided as much as possible, and for that purpose, preferably, the formation of the organic material layer 3 to the formation of the counter electrode 7 are performed continuously in a vacuum environment.

In the luminescent element of the present invention, preferably, an airtight case is provided so as to cover the laminate 5, the sealing film 6, and the counter electrode 7.

When a voltage is applied to the luminescent element by a driving power supply 8 at room temperature and at normal humidity, luminescence is observed as the current is increased. Preferably, the luminescence is performed by DC driving or pulsed driving.

In such a case, since Joule heat is generated as the current flowing through the element increases, in the ferroelectric material of the sealing film 6, such as $BaTiO_3$, phase transition occurs at a certain Curie point, and simultaneously, the ferroelectric material is poled by a voltage from a poling power supply 9, resulting in dielectric polarization. Since the ferroelectric material such as $BaTiO_3$ has a large dielectric polarization (hysteresis of spontaneous polarization), even after the operation of the element is completed, the polarization state is maintained, and the space charges accumulated during the application of the voltage is diffused, thus enabling the stable operation of the element and the prolonged life.

Examples of ferroelectric materials used in the present invention include $BaO$—$TiO_2$-based compounds such as $BaTiO_3$, $SrTiO_3$, $KNbO_3$, $LiNbO_3$, $Sr_{1-x}Ba_xNb_2O_6$, double oxides having sillenite structure, such as $\gamma$-$Bi_2O_3$, and Pb(Zr.Ti)O$_3$ or Pb(Zr.Ti)O$_3$ in which trivalent La$^{3+}$ ions or Bi$^{3+}$ ions are partially substituted for Pb$^{+2}$ ions.

Examples of methods for forming the sealing film 6 containing the ferroelectric material used in the present invention include dry processes, such as an electron-beam deposition process, RF sputtering, ion-beam sputtering, ion plating, a chemical vapor deposition (CVD) process, and a metal-organic chemical vapor deposition (MO-CVD) process; and chemical methods, such as a sol-gel process, an alkoxide process, an oxalic acid process, and hydrothermal synthesis.

The sealing film 6 used in the present invention may be formed by a method in which microparticles containing the ferroelectric material are mixed with a thermoplastic resin, such as a polycarbonate resin or a polystyrene resin, a thermosetting resin such as a phenolic resin, or an ultraviolet-curable resin such as an acrylic resin or an epoxy resin, alone or as a copolymer thereof, and an organic solvent, and deposition is performed by spin coating or the like.

In the luminescent element of the present invention, the organic material layer 3 may be composed of a hole-transporting compound or a polymeric hole-transporting material, which is under study in the electrophotographic photoreceptor field, a dopant luminescent material, an electron-transporting luminescent material, an electron-transporting material, or a polymeric electron-transporting material, alone or in combination. Chemical formulae of examples of those materials are shown below.

HOLE-TRANSPORTING COMPOUNDS

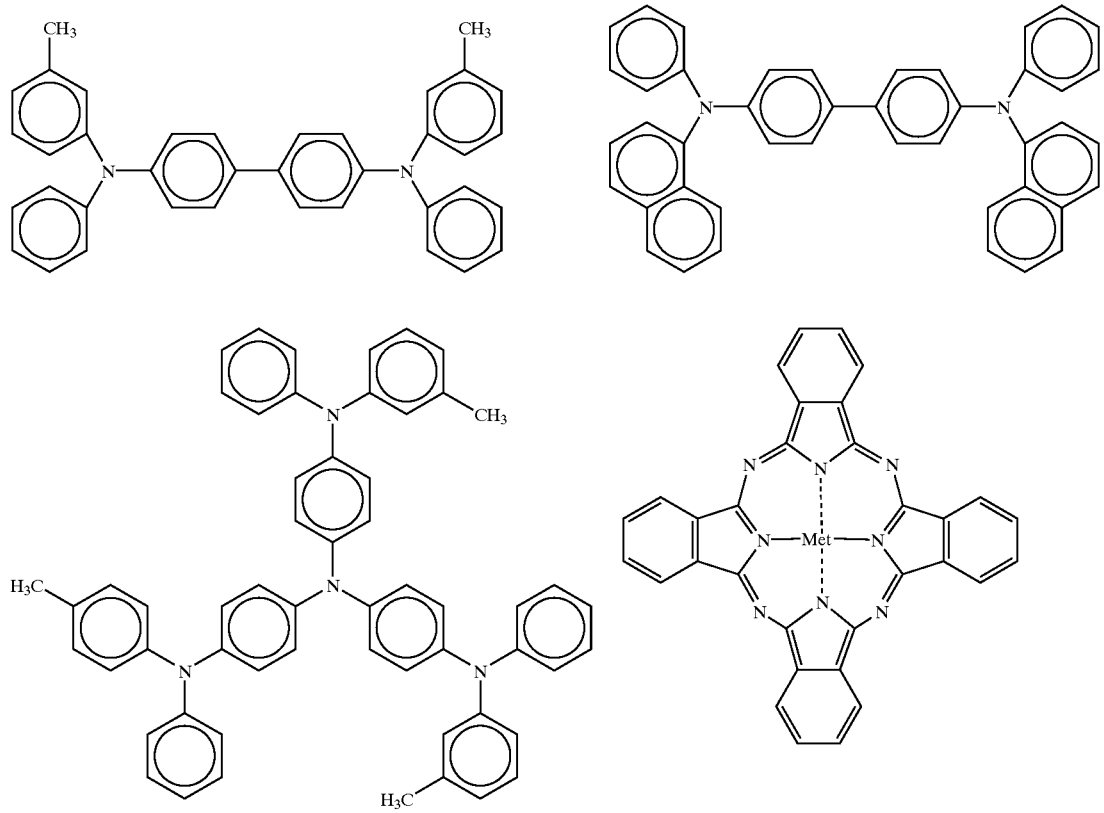

Met = Cu, Mg, AlCl, TiO, SiCl$_2$, etc.

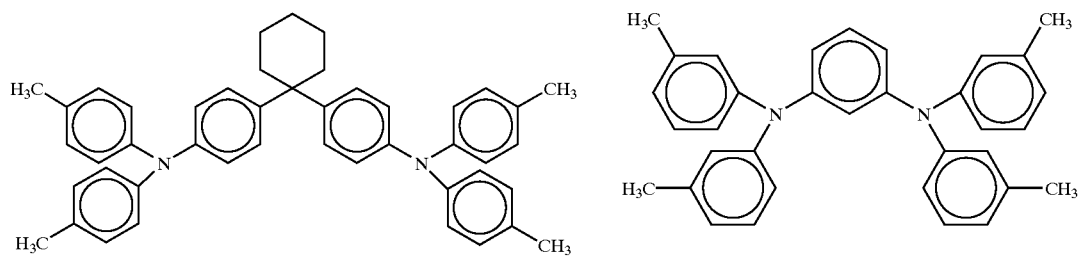

-continued
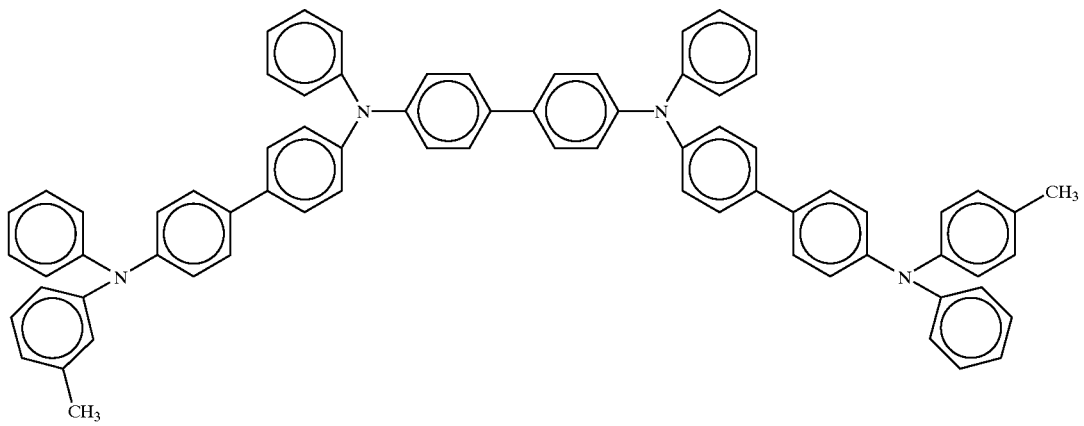
POLYMERIC HOLE-TRANSPORTING MATERIALS
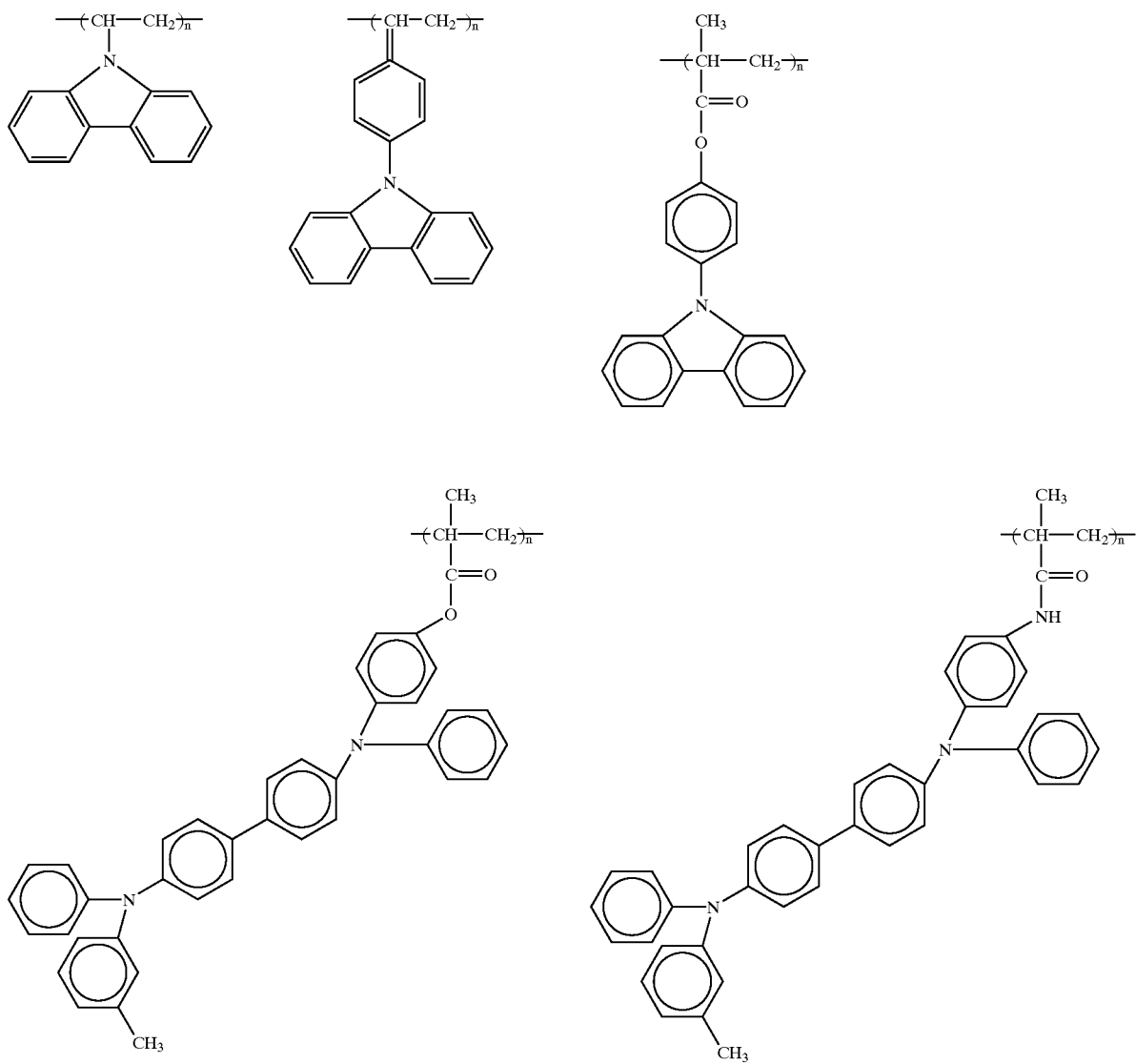

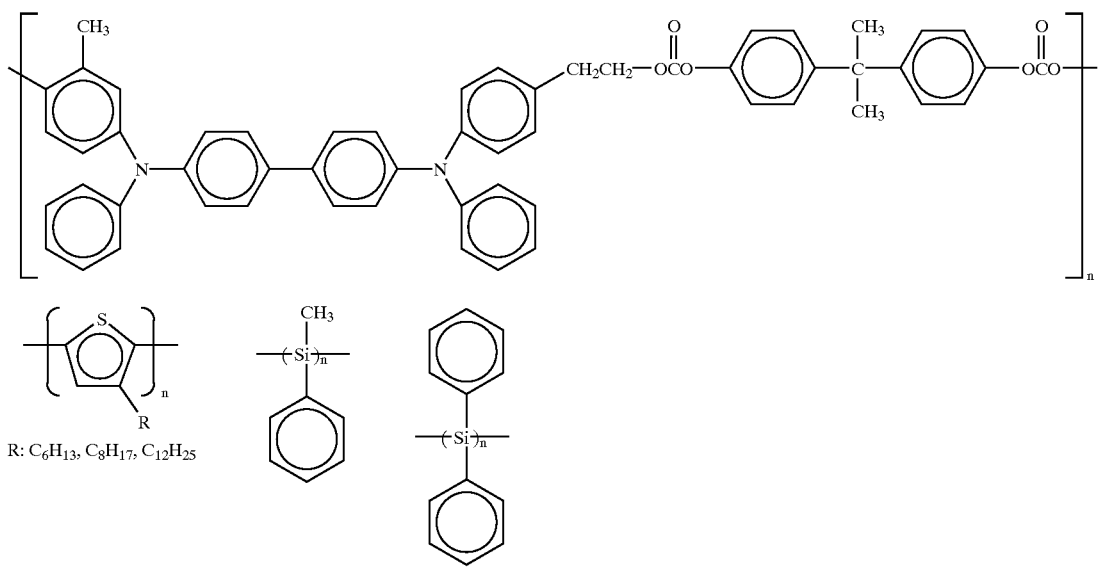
DOPANT LUMINESCENT MATERIALS
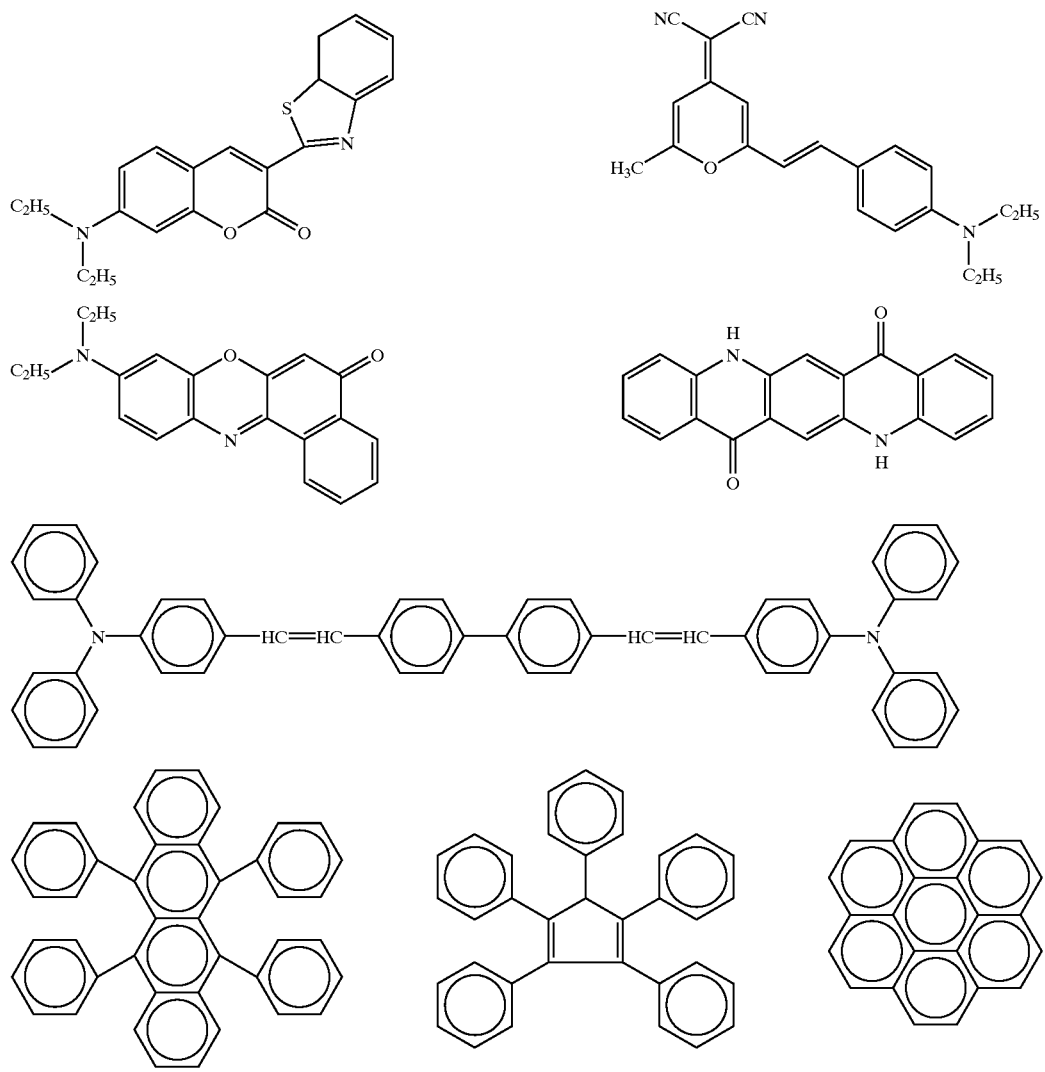

-continued
ELECTRON-TRANSPORTING LUMINESCENT MATERIALS
(ORGANOMETALLIC COMPLEXES)
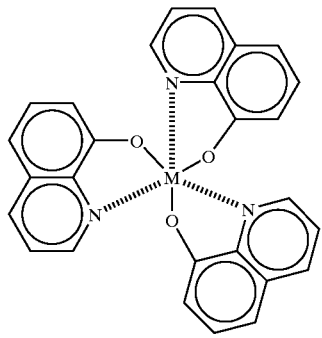
M: Al, Ga
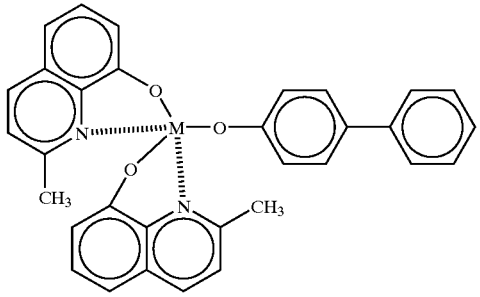
M: Al, Ga
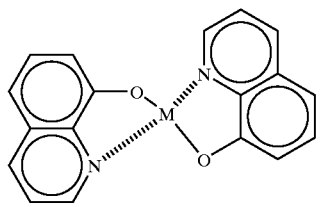
M: Zn, Mg, Be
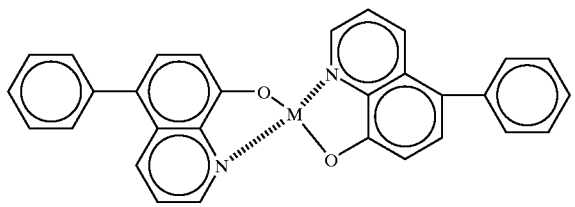
M: Zn, Mg, Be
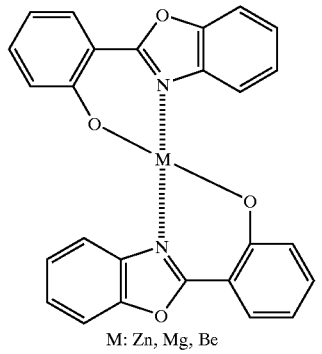
M: Zn, Mg, Be
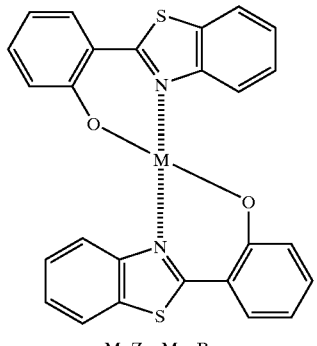
M: Zn, Mg, Be
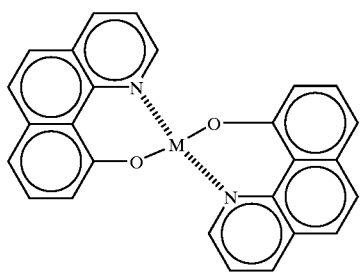
M= Zn, Mg, Be
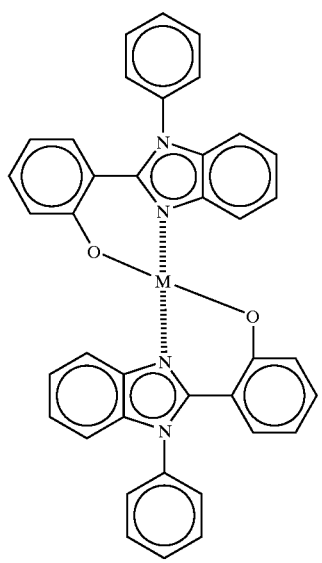
M: Zn, Mg, Be

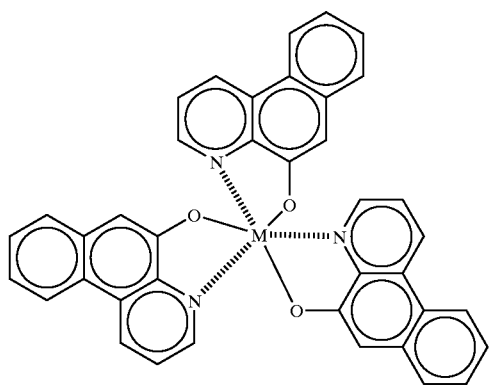
M= Al, Ga
ELECTRON-TRANSPORTING MATERIALS
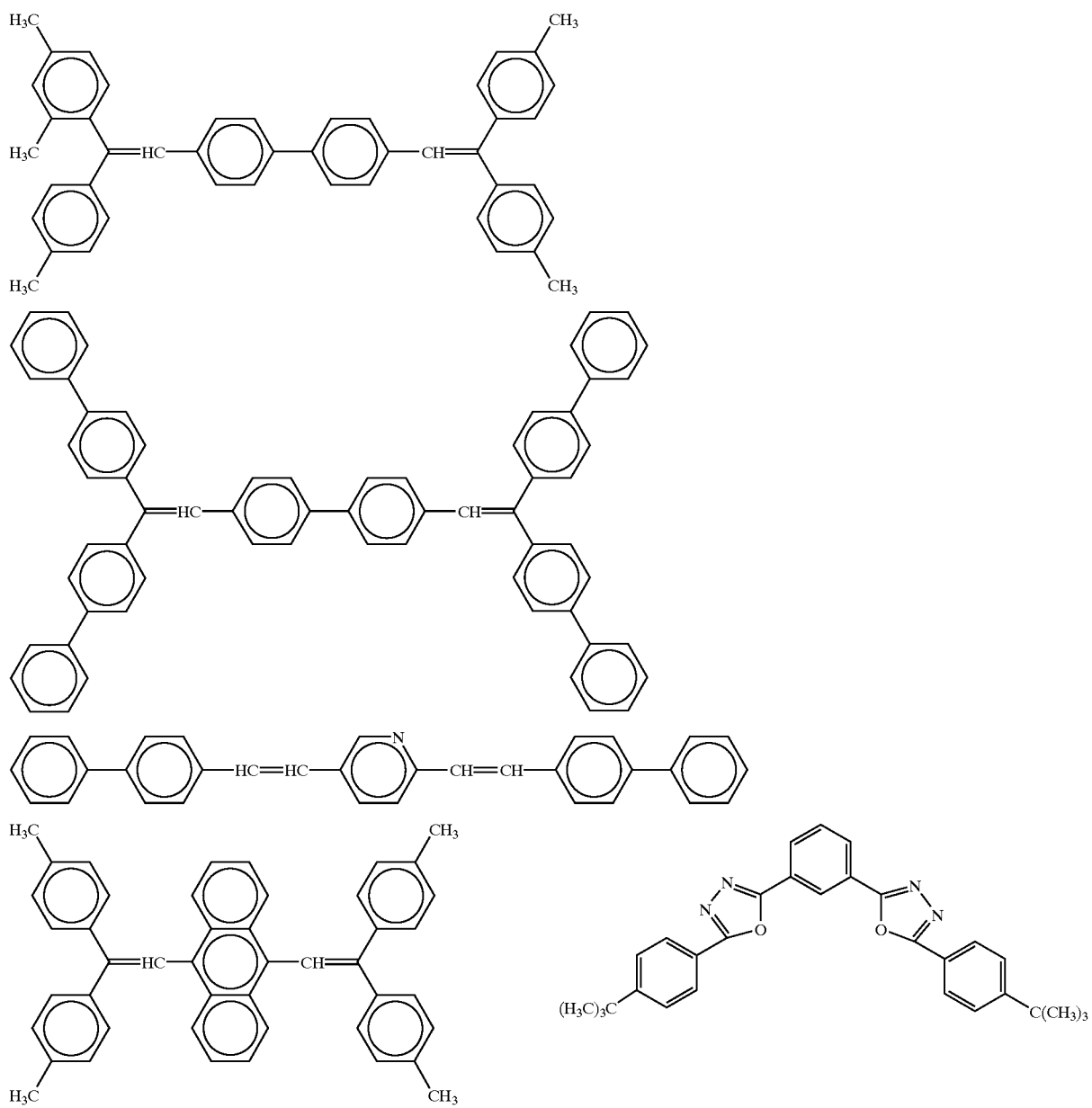

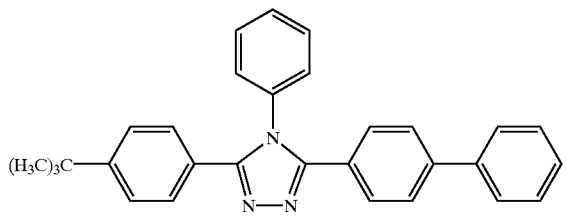
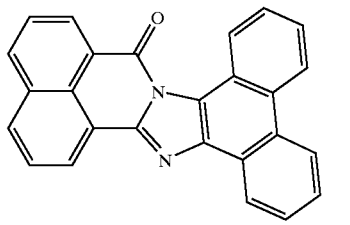
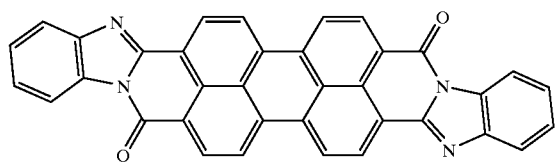
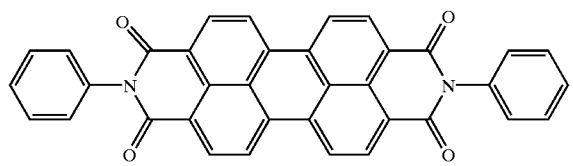
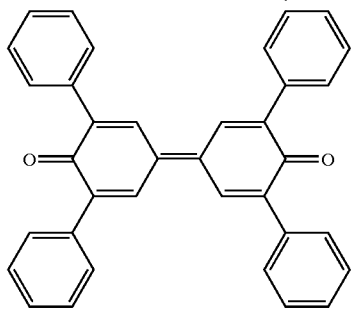

POLYMERIC ELECTRON-TRANSPORTING MATERIALS

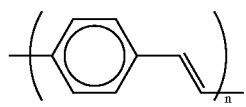
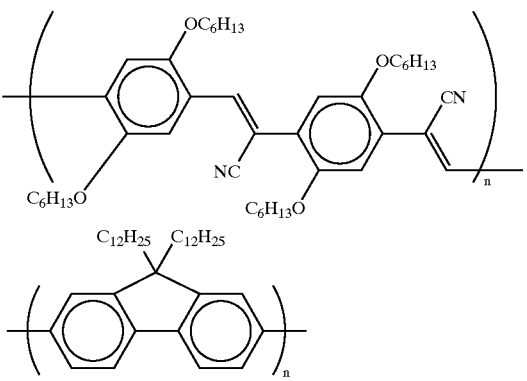
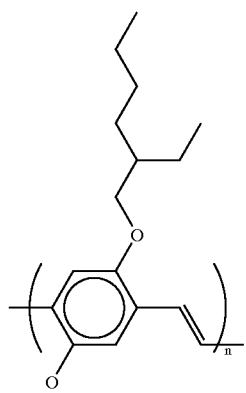
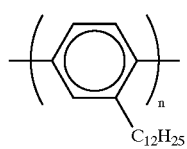
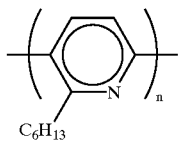

In the luminescent element of the present invention, the organic material layer 3 containing the constituent described above is generally formed by a vacuum deposition process or using a binding resin.

Non-limiting examples of the binding resins include polyvinyl carbazole resins, polycarbonate resins, polyester resins, polyarylate resins, butyral resins, polystyrene resins, polyvinyl acetal resins, diallyl phthalate resins, acrylic resins, methacrylic resins, phenol resins, epoxy resins, silicon resins, polysulfone resins, and urea resins. These binding resins may be used alone or in combination.

The material for the anode 2 preferably has a large work function. Preferred examples of such a material include nickel, gold, platinum, palladium, selenium, rhenium, and iridium; alloys thereof; and tin oxide, indium tin oxide (ITO), and copper iodide. Conductive polymers, such as poly(3-methylthiophene), polyphenylene sulfide, and polypyrrole, may also be used.

In contrast, a material having a small work function is used for the cathode 4. Examples of such a material include silver, lead, tin, magnesium, aluminum, calcium, manganese, indium, and chromium, and alloys thereof.

It is preferable that at least one of the anode 2 and the cathode 4 transmits 50% or more of incident light over the emission wavelength range of the element.

As the substrate 1 used in the present invention, a transparent substrate, for example, composed of glass or a plastic film, is preferably used.

In the luminescent element of the present invention, a protective layer is preferably provided on the sealing film 6 (or the counter electrode 7) in order to protect the laminate 5, including the anode 2, the cathode 4, and the organic material layer 3, from the outside.

Examples of the material for the protective layer include inorganic compounds, for example, oxides, such as SiO, $SiO_2$, $Al_2O_3$, TiO, $ZrO_2$, and ZnO, nitrides, such as TiN, $Al_2N_3$, and $Si_3N_4$, and fluorides, such as LiF and $MgF_2$; and insulating polymer compounds, such as polyethylene, polypropylene, polystyrene, polymethyl methacrylate, polyimides, polyurea, polytetrafluoroethylene, polychlorotrifluoroethylene, polydichlorodifluoroethylene, chlorotrifluoroethylene, polyvinyl trimethylsilane, and polysiloxane. The protective layer may be formed into a single layer or a plurality of layers using the material described above by a vacuum deposition process, sputtering, a chemical vapor deposition process, or the like.

In the luminescent element of the present invention, an airtight case composed of an insulating glass or plastic is provided on the exterior of the anode 2, the cathode 4, the organic material layer 3, and the sealing film 6, (and also the counter electrode 7 and the protective film). For example, when the airtight case is composed of an insulating glass, the insulating glass is disposed on the substrate 1, which may be a glass substrate, so as to cover the laminate comprising the anode 2, the organic material layer 3, and the cathode 4 with a space for forming a shielding layer therebetween, and the edge of the substrate 1 and the edge of the insulating glass are bonded together using an adhesive or the like.

Preferably, the insulating glass has a low alkali content and a high volume resistivity ($10^7$ Ωm or more at 350° C.), and a specific example is Corning glass #7059 from Corning Company, Inc.

When the airtight case is composed of a plastic, any shape or any material may be acceptable as long as the airtight case satisfactorily covers the laminate 5 including the anode 2, the organic material layer 3, and the cathode 4, and the sealing film 6, (and the counter electrode 7).

The luminescent element of the present invention, unlike conventional incandescent lamps, fluorescent lamps, light emitting diodes, etc., can be used for organic LED panels which are thin, lightweight, solid-state devices having a large area and high resolution, and are capable of high-speed operation, thus satisfying advanced requirements.

The present invention will be described in more details with reference to the following examples.

EXAMPLE 1 AND COMPARATIVE EXAMPLES 1 AND 2

A glass plate of 25×75×1 mm (plate color glass manufactured by HOYA corporation) was used as a substrate, and an ITO layer was deposited at a thickness of 100 nm on the substrate to form a transparent electrode. The substrate was subjected to ultrasonic cleaning using isopropyl alcohol for 30 minutes, followed by cleaning with purified water, and the substrate was rinsed using isopropyl alcohol and was dried by spraying of dry nitrogen gas. The substrate was then cleaned for 10 minutes using a UV-ozone cleaner manufactured by SAMCO International, Inc.

The cleaned substrate was fixed by a substrate holder of a commercially available vacuum evaporator manufactured by ULVAC Japan, Ltd., 200 mg of N,N'-diphenyl-N,N'-bis-(3-methylphenyl)-[1,1'-biphenyl]-4,4'-diamine (hereinafter referred to as "TPDA") was placed in a resistance heating boat made of molybdenum, and 200 mg of sublimation-refined tris(8-quinolinol)aluminum (hereinafter referred to as "Alq.") was placed in another resistance heating boat made of molybdenum. The vacuum pressure of a vacuum chamber containing the resistance heating boats was then decreased to $1 \times 10^{-4}$ Pa.

The resistance heating boat with TPDA was heated to 215 to 220° C., and TPDA was deposited on the ITO film at a deposition rate of 0.1 to 0.3 nm/s, and thereby a hole-injecting layer with a thickness of 40 nm was formed. At this stage, the substrate temperature was equal to room temperature. Next, while the substrate provided with the hole-injecting layer was still being fixed by the substrate holder, the resistance heating boat with Alq. was heated to 275° C., and Alq. was deposited on the hole-injecting layer at a deposition rate of 0.1 to 0.2 nm/s, and thereby a luminescent layer with a thickness of 60 nm was formed. At this stage, the substrate temperature was also equal to room temperature.

Next, a resistance heating boat made of molybdenum in which 1 g of magnesium had been placed in advance and a resistance heating boat made of molybdenum in which 500 mg of silver had been placed in advance were heated, and magnesium was deposited at a deposition rate of approximately 1.5 nm/s and simultaneously silver was deposited at a deposition rate of approximately 0.1 nm/s. An electrode (cathode) with a thickness of 200 nm composed of a mixed metal containing magnesium and silver was thereby provided on the luminescent layer. In this way, by forming the ITO layer (anode), the hole-injecting layer, the luminescent layer, and the cathode on the glass substrate, an organic LED element was obtained.

Subsequently, a sealing film was formed on the exterior of the laminate, which includes the ITO layer, the hole-injecting layer, the luminescent layer, and the cathode, provided on the glass substrate, using the same vacuum evaporator as that used for forming the laminate, in a continuous vacuum environment from the formation of the hole-injecting layer and the luminescent layer, as described below.

First, as a vapor source target, a powder obtained by calcining a mixture of $Pb_3O_4$ and $TiO_2$ powders, followed by pulverizing, was placed and retained on a quartz plate.

Next, after the vacuum pressure of the vacuum chamber was decreased to $1 \times 10^{-4}$ Pa, a sputtering gas (Ar:$O_2$=9:1) was introduced so that the gas pressure was 30 Pa using an RF sputtering process, and the target was sputtered at an RF voltage of 1.6 kV and an RF power of 150 W, and thus a sealing film containing $PbTiO_3$ with a thickness of 0.5 μm was formed on the cathode.

After the RF discharge and the introduction of the gas were stopped, aluminum as a counter electrode was deposited at a thickness of 150 nm on the sealing film.

Next, nitrogen gas was introduced into the vacuum evaporator to reset the pressure to atmospheric pressure, an airtight case composed of an insulating glass (Corning glass #7059)

was placed, and bonding was performed using an epoxy adhesive (Cemedine Super 5 manufactured by Cemedine Co., Ltd.). An organic LED element in Example 1 was thereby fabricated.

An organic LED element in Comparative Example 1 was fabricated in the same manner as that in Example 1 apart from the fact that the sealing film and the counter electrode were not provided. Furthermore, an organic LED element in Comparative Example 2 was fabricated in the same manner as that in Example 1 apart from the fact that the sealing film was provided between the Alq. layer as the luminescent layer and the cathode.

The elements thus obtained were driven for 2,000 hours at a driving current of 10 mA/cm$^2$ and at a poling voltage of 8 V (only for the element in Example 1), in a cycle of turning-on time: 1 second and turning-off time: 5 seconds.

The luminance of the element in Example 1 was 200 cd/m$^2$ at the start and the luminance after 2,000 hours was 120 cd/m$^2$, while the luminance of the element in Comparative Example 1 decreased to 10 cd/m$^2$ after 2,000 hours. With respect to the element in Comparative Example 2, the current did not substantially flow, and light emission was not observed.

EXAMPLES 2 AND 3

In the same manner as that in Example 1, an ITO layer (anode), a hole-injecting layer, a luminescent layer, and a cathode were formed on a glass substrate.

After the pressure was reset to atmospheric pressure by injecting nitrogen gas into the vacuum evaporator, a coating solution, which was obtained by mixing $BaTiO_3$ particles having an average particle size of 0.2 μm and a polycarbonate resin at a weight ratio of 2:1 in a chloroform solution, was spin-coated on the laminate, followed by drying, to form a sealing film with a thickness of 1 μm. Furthermore, in the same manner as that in Example 1, an airtight case was provided by bonding. An organic LED element in Example 2 was thereby fabricated. An organic LED element in Example 3 was also fabricated in the same manner as that in Example 2 apart from the fact that the counter electrode was not provided.

The element in Example 2 was evaluated in a manner similar to that in Example 1 apart from the fact that the poling voltage was set at 15 V. The luminance was 200 cd/m$^2$ at the start and the luminance after 2,000 hours was 100 cd/m$^2$, from which it was obvious that the element in Example 2 had a longer life than that of the element in Comparative Example 1. With respect to the element in Example 3 to which a poling voltage was not applied because a counter electrode was not provided, although the evaluation results were not so good as those of the element in Example 2, the luminance was 200 cd/m$^2$ at the start and the luminance after 2,000 hours was 50 cd/m$^2$, from which it was obvious that the element in Example 3 had a longer life than that of the element in Comparative Example 1.

EXAMPLE 4

An organic LED element was fabricated in the same manner as that in Example 1 apart from the fact that the sealing film was formed using the materials and the method described below.

First, as a vapor source target, high-purity (99.9%) powders of $PbTiO_3$, $(Pb_{1-x}La_x)Ti_{1-x/4}O_3$, and $Pb(Zr_xT_{1-x})O_3$ and a PbO powder were placed and retained on a quartz plate.

Next, after the vacuum pressure of the vacuum chamber was decreased to $1\times10^{-4}$ Pa, a sputtering gas ($Ar:O_2=7:3$) was introduced so that the gas pressure was 10 Pa using a magnetron sputtering process, and the target was sputtered at an anode voltage of 2.6 kV and a power density of 2 W/cm$^2$. A sealing film containing PZT was formed at a deposition rate of 50 Å/min with a thickness of 0.4 μm on the cathode.

A counter electrode and an airtight case were provided in the same manner as that in Example 1. An organic LED element in Example 4 was thereby fabricated. The element was evaluated in the same manner as that in Example 1 apart from the fact that the poling voltage was set at 10 V. The luminance was 200 cd/m$^2$ at the start and the luminance after 2,000 hours was 140 cd/m$^2$, from which it was obvious that the element in Example 4 had a longer life than that of the element in Comparative Example 1.

While the present invention has been described with reference to what are presently considered to be the preferred embodiments, it is to be understood that the invention is not limited to the disclosed embodiments. On the contrary, the invention is intended to cover various modifications and equivalent arrangements included within the spirit and scope of the appended claims. The scope of the following claims is to be accorded the broadest interpretation so as to encompass all such modifications and equivalent structures and functions.

What is claimed is:

1. An organic luminescent element comprising:
   a substrate;
   an anode connected to a driving power supply;
   a cathode connected to the driving power supply;
   a counter electrode connected to a poling power supply;
   at least one organic material layer interposed between the anode and the cathode; and
   a sealing film containing a ferroelectric material interposed between the counter electrode and one of the anode or the cathode,
   wherein said one of the anode or the cathode is connected to the poling power supply.

2. An organic luminescent element according to claim 1, wherein the sealing film is provided on the cathode.

3. An organic luminescent element according to claim 1, wherein the sealing film is provided on the anode.

4. An organic luminescent element according to claim 1, wherein the substrate is transparent.

5. An organic luminescent element according to claim 1, wherein the anode comprises indium tin oxide (ITO).

6. An organic luminescent element according to claim 1, wherein light emission is performed by one of DC driving and pulsed driving.

7. An organic luminescent element according to claim 1, wherein an electric potential applied to the counter electrode is higher than that applied to the cathode.

8. An organic luminescent element according to claim 7, wherein a positive electric potential is applied to the counter electrode.

9. An organic luminescent element according to claim 1, wherein the electric potential applied to the counter electrode is lower than that applied to the anode.

10. An organic luminescent element according to claim 9, wherein a negative electric potential is applied to the counter electrode.

* * * * *

UNITED STATES PATENT AND TRADEMARK OFFICE
CERTIFICATE OF CORRECTION

PATENT NO.   : 6,583,557 B2
DATED        : June 24, 2003
INVENTOR(S)  : Yuichi Hashimoto et al.

It is certified that error appears in the above-identified patent and that said Letters Patent is hereby corrected as shown below:

Column 4,
Line 1, "DRAWINGS" should read -- DRAWING --; and
Line 33, "etc." should read -- etc., --.

Column 13,
First chemical structure under "ELECTRON-TRANSPORTING MATERIALS",

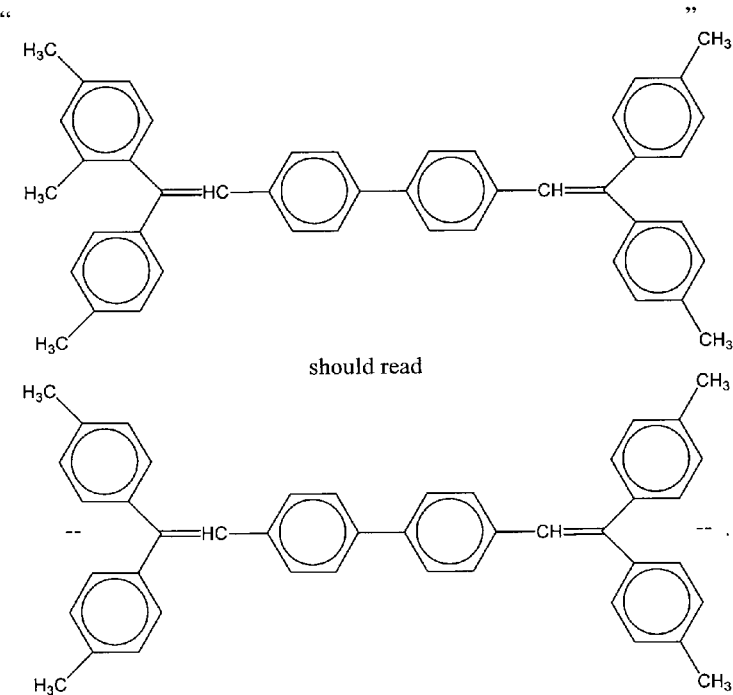

JAMES E. ROGAN
*Director of the United States Patent and Trademark Office*